(12) United States Patent
Peake et al.

(10) Patent No.: US 7,232,726 B2
(45) Date of Patent: Jun. 19, 2007

(54) TRENCH-GATE SEMICONDUCTOR DEVICE AND METHOD OF MANUFACTURING

(75) Inventors: Steven T. Peake, Warrington (GB); Philip Rutter, Stockport (GB)

(73) Assignee: NXP, B.V., Eindhoven (NL)

( * ) Notice: Subject to any disclaimer, the term of this patent is extended or adjusted under 35 U.S.C. 154(b) by 328 days.

(21) Appl. No.: 10/515,749

(22) PCT Filed: May 21, 2003

(86) PCT No.: PCT/IB03/02230

§ 371 (c)(1),
(2), (4) Date: Nov. 24, 2004

(87) PCT Pub. No.: WO03/103036

PCT Pub. Date: Dec. 11, 2003

(65) Prior Publication Data

US 2005/0208722 A1    Sep. 22, 2005

(30) Foreign Application Priority Data

May 31, 2002  (GB) .................................. 0212564.9
Feb. 12, 2003  (GB) .................................. 0303162.2

(51) Int. Cl.
*H01L 21/336* (2006.01)

(52) U.S. Cl. ................. 438/270; 438/589; 257/E21.419

(58) Field of Classification Search ................ 438/137, 438/138, 270, 271, 273, 589; 257/E21.419
See application file for complete search history.

(56) References Cited

U.S. PATENT DOCUMENTS

| 4,914,058 A | 4/1990 | Blanchard |
| 5,108,783 A * | 4/1992 | Tanigawa et al. ........... 438/359 |
| 5,998,833 A | 12/1999 | Baliga |
| 6,175,225 B1 | 1/2001 | De Groot |
| 6,433,385 B1 * | 8/2002 | Kocon et al. ............... 438/270 |

FOREIGN PATENT DOCUMENTS

| DE | 100 38 177 A1 | 2/2002 |
| EP | 1 170 803 A2 | 1/2002 |

* cited by examiner

*Primary Examiner*—Chandra Chaudhari
(74) *Attorney, Agent, or Firm*—Peter Zawilski

(57) ABSTRACT

Consistent with an example embodiment a trench-gate semiconductor device, for example a MOSFET or IGBT, having a field plate provided below the trenched gate is manufactured using a process with improved reproducibility. The process includes the steps of etching a first grove into the semiconductor body for receiving the gate, and etching a second groove into the top major surface of the semiconductor body, the second groove extending from the first groove and being narrower than the first groove. The invention enables better control of the vertical extent of the gate below the top major surface of the semiconductor body.

12 Claims, 6 Drawing Sheets

TRENCH-GATE SEMICONDUCTOR DEVICE AND METHOD OF MANUFACTURING

The present invention relates to trench-gate semiconductor devices, for example insulated-gate field effect power transistors (commonly termed "MOSFETs"), or insulated-gate bipolar transistors (commonly termed "IGBTs").

Such trench-gate semiconductor devices are known having a source region and a drain region of a first conductivity type which are separated by a channel-accommodating region adjacent to the gate. U.S. Pat. No. 5,998,833 describes a vertical device of this type which includes a trench-based source electrode, between the gate electrode and the bottom of the trench. The trench-based source electrode is electrically connected to the source electrode of the device. It is provided with a view to improving the breakdown and high frequency switching characteristics of the device with minimal impact on its specific on-state resistance.

EP-A-1170803 discloses a similar structure to that referred to above in relation to U.S. Pat. No. 5,998,833. A "shield gate" is located below the gate electrode, near the bottom of the trench. In particular, it describes a device in which the shield gate is connected to the source region. The contents of U.S. Pat. No. 5,998,833 and EP-A-1170803 are hereby incorporated herein as reference material.

It is an object of the present invention to provide an improved method for manufacturing a trench-gate semiconductor device having a trenched electrode below the gate.

The present invention provides a method of manufacturing a trench-gate semiconductor device, the device including a semiconductor body defining a first portion of a trench having an insulated gate therein, a second portion of the trench extending from the bottom of the first trench portion, the semiconductor body comprising a source region and a drain region of a first conductivity type which are separated by a channel-accommodating region adjacent to the first trench portion, the drain region comprising a drain drift region and a drain contact region, with the drain drift region between the channel-accommodating region and the drain contact region, and the drain drift region doped to a lesser extent than the drain contact region, and a field plate in the second portion of the trench between the gate and the drain contact region, the method including the steps of:

(a) etching a first groove into the semiconductor body;

(b) forming spacers adjacent the sidewalls of the first groove which define a window therebetween;

(c) etching a second groove into the semiconductor body through the window between the spacers, the second groove extending from the bottom of the first groove towards the drain contact region and being narrower than the first groove; and (d) forming a field plate insulating layer by oxidising the bottom and sidewalls of the second groove.

In the above process, the vertical extent of the field plate insulating layer is self-aligned with the bottom of the first groove owing to the presence of the spacers. This ensures greater uniformity in the device structure in its manufacture.

In contrast, in the process shown in U.S. Pat. No. 5,998,833 for example, the vertical extent of the insulating layer around the trench-based source electrode is defined by the end point of an etch back step which is not self-aligned with the rest of the structure.

In a preferred embodiment, a method of the invention includes the steps of:

(e) providing the field plate over the field plate insulating layer in the second groove by filling the first and second grooves with electrode material and etching it back until the field plate insulating layer is exposed;

(f) removing the spacers;

(g) forming a gate insulating layer over the field plate and at the bottom and sidewalls of the first groove; and (h) providing the gate over the gate insulating layer.

Thus, the etching back of the field plate electrode has a clearly defined end point, namely the exposure of the upper surface of the field plate insulating layer. The upper extent of the field plate may thereby be reliably and reproducibly aligned with the bottom of the first groove. Exposure of the field plate insulating layer may be detected using well known spectrometry techniques.

According to an alternative preferred embodiment, a method of the invention includes the steps of:

(i) removing the spacers;

(j) forming a gate insulating layer over the bottom and sidewalls of the first groove; and then (k) filing the first and second grooves with electrode material to form the gate and field plate.

The invention further provides a trench-gate semiconductor device manufactured according to a method as described herein, in which the width of the first trench portion is greater than the width of the second trench portion.

In embodiments where the field plate is insulated from the gate, the field plate may be connected to the source region. Alternatively, it may be connected to a bias potential greater than the gate potential and near to the bulk breakdown voltage of the drain drift region. A device having a field plate connected in this way and a method for its manufacture are described in the applicant's copending United Kingdom Patent Application No. 0212564.9 (our ref. PHGB020083), the contents of which are incorporated herein by reference.

The inventors have realised that connection of such an insulated field plate to a potential close to the bulk breakdown voltage of the drain drift region causes the potential drop across the drain drift region to be spread considerably more evenly particularly at applied voltages greater than the bulk breakdown voltage, thereby substantially increasing the breakdown voltage of the device. This enables a higher level of doping to be used in the drain drift region relative to a device without the field plate having the same breakdown characteristics, thereby providing devices with a lower specific on-state resistance.

The present invention also provides a module comprising a device having a configuration defined above along with one or more other semiconductor devices, wherein the field plate is conveniently connected to an internal voltage line of the module. Alternatively, an additional external terminal may be provided on the device (in the case of a discrete device) or the module which is electrically connected to the field plate. This enables a dedicated voltage level for the field plate to be applied.

Embodiments of the invention will now be described by way of example and with reference to the accompanying schematic drawings, wherein.

Figure 1:
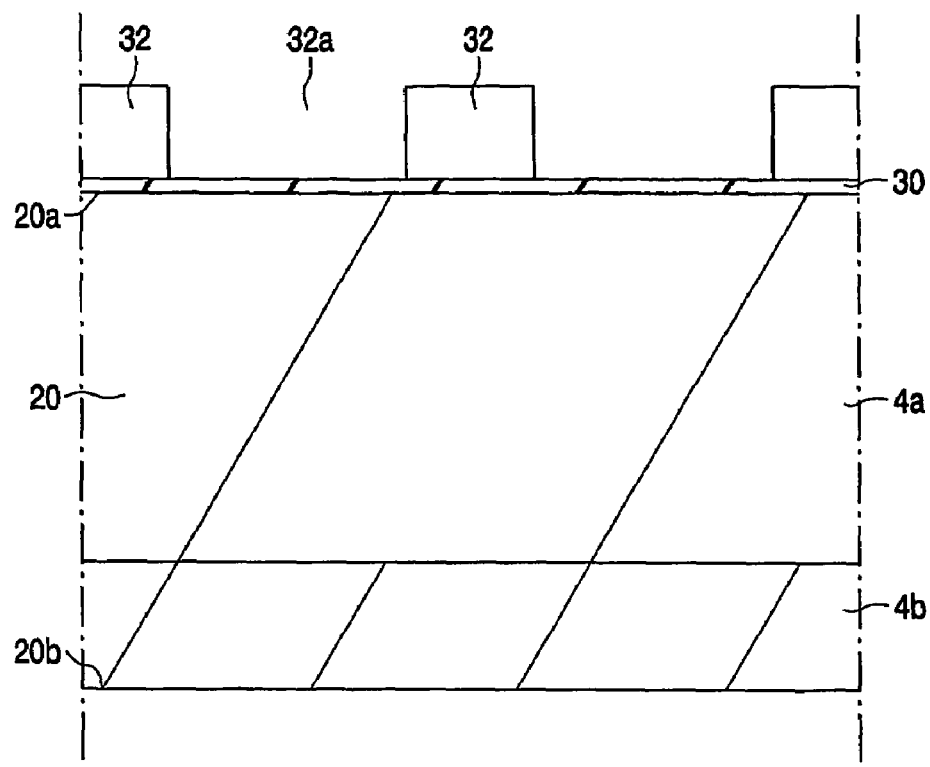
FIGS. 1 to 6 are cross-sectional views of transistor cell areas of a semiconductor body at successive stages in the manufacture of a trench-gate semiconductor device according to an embodiment of the invention.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar features in modified and different embodiments.

Figure 6:
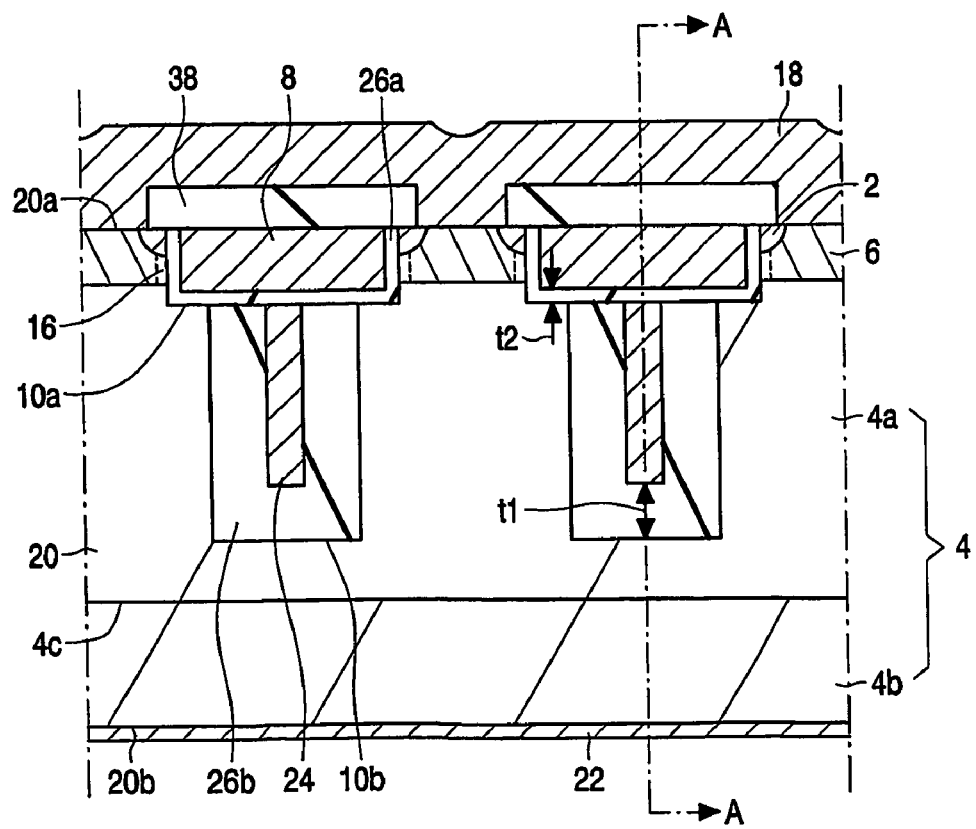

FIG. 6 illustrates an exemplary embodiment of a power semiconductor device in accordance with the invention. Source and drain regions 2 and 4, respectively of a first conductivity type (n-type in this example) are separated by a channel-accommodating region 6 of the opposite, second conductivity type (that is, p-type in this example).

By way of example, FIG. 6 shows a vertical device structure in which region 4a may be a drain drift region formed by an epitaxial layer of higher resistivity (lower doping) on a substrate, drain contact region 4b of relatively high conductivity. The drain drift and contact regions 4a and 4b form a junction 4c therebetween. The drain contact region 4b may be of the same conductivity type (n-type in this example) as the region 4a to provide a vertical MOSFET, or it may be of opposite conductivity type (p-type in this example) to provide a vertical IGBT.

A gate 8 is present in a first trench portion 10a which extends through the regions 2 and 6 and into an underlying portion of the drain drift region 4a. The application of a voltage signal to the gate 8 in the on-state of the device serves in known manner to induce a conduction channel 16 in the region 6 and to control current flow in this conduction channel 16 between the source and drain regions 2 and 4.

The source region 2 is contacted by a source electrode 18 in the case of a MOSFET at the top major surface 20a of the device semiconductor body 20 (typically of monocrystalline silicon). The drain contact region 4b is contacted by an electrode 22, called the drain electrode in the case of a MOSFET, at the bottom major surface 20b of the device semiconductor body 20. The source and drain electrodes 18 and 22 are known as the emitter and collector, respectively, in an IGBT.

A field plate 24 is provided in a second trench portion 10b, between the gate 8 and the drain drift region 4a. The field plate is preferably formed of doped polycrystalline silicon of the first conductivity type. Alternatively, it may be made of metal, for example. The field plate 24 is insulated from the surrounding semiconductor body 20 by a field plate insulating layer 26b. The gate 8 is insulated from the field plate 24, the semiconductor body 20, and the source electrode 28 by gate insulating layer 26a. This layer may consist of silicon dioxide, for example.

In the embodiment shown in FIG. 6, the second trench portion 10b extends into the semiconductor body 20 to a depth close to the junction 4c between the drain drift and contact regions, 4a and 4b. As is well known in the art, in practice, there is a doping transition region between regions 4a and 4b, as there is dominant diffusion of dopant atoms from the more highly doped drain contact region into the drain drift region. Typically, this out-diffusion extends 1 to 1.5 microns above the junction 4c. Preferably, the second trench portion 10b extends to a depth immediately above the transition region.

The field plate 24 is spaced from the bottom and sidewalls of the second trench portion 10b by a layer of insulating material 26b of thickness t1. The gate 8 is spaced from the semiconductor body and the field plate by a layer of insulating material of thickness t2. Thickness t2 may be of the order of 38 nm, whilst t1 may be of the order of 0.4 micron, for example. A relatively thick layer is desirable below the field plate (ie. t1), particularly for higher levels of doping in the drain drift region 4a, so that it is able to withstand the high electric fields produced at the corners of the trench.

Figure 7:
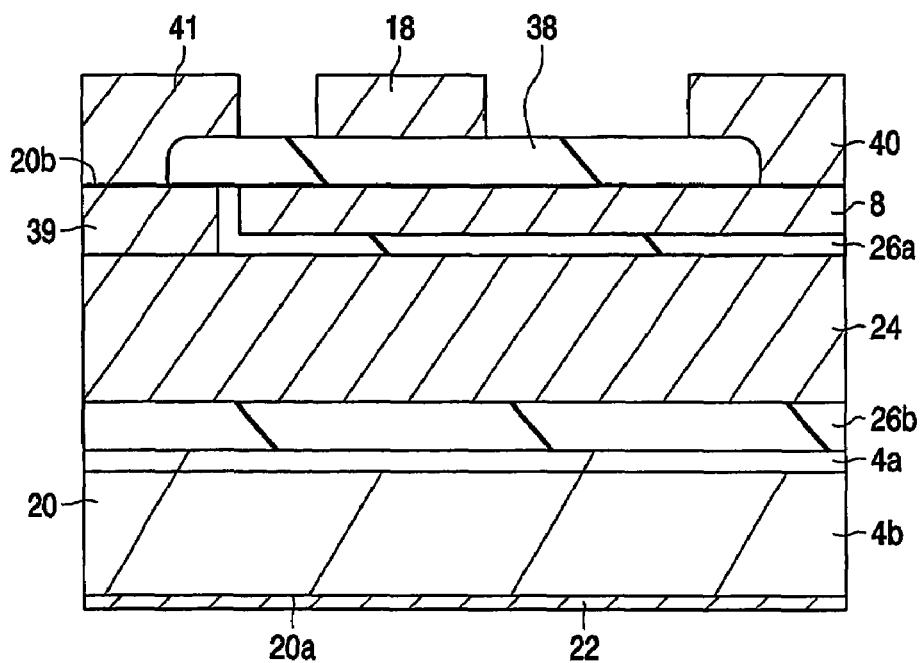
FIG. 7 is a cross-sectional view along line A-A of the device shown in FIG. 6.

FIG. 7 shows a cross-section through the device of FIG. 6, along line A-A. It illustrates an example of how a connection to the field plate 24 may be made from outside the semiconductor body 20, independently of the gate and source electrodes.

Doped polycrystalline silicon contact layer 39 is provided towards one end of the first trench portion 10a and is electrically connected to the field plate 24. It extends from the field plate to the top major surface 20a of the device semiconductor body 20, where it is contacted by a field plate contact electrode 41. The gate 8 is electrically connected to a gate contact electrode 40 towards the other end of the first trench portion 10a.

Successive stages in the manufacture of the transistor cells of FIG. 6 will now be described with reference to FIGS. 1 to 6.

Initially, a thin layer 30 of silicon dioxide is grown on the top major surface 20a of the semiconductor body 20 (FIG. 1). Mask 32 is provided thereover, which may be formed in a standard manner using photolithography and etching. The mask may be formed of photoresist for example, and defines windows 32a.

Figure 2:
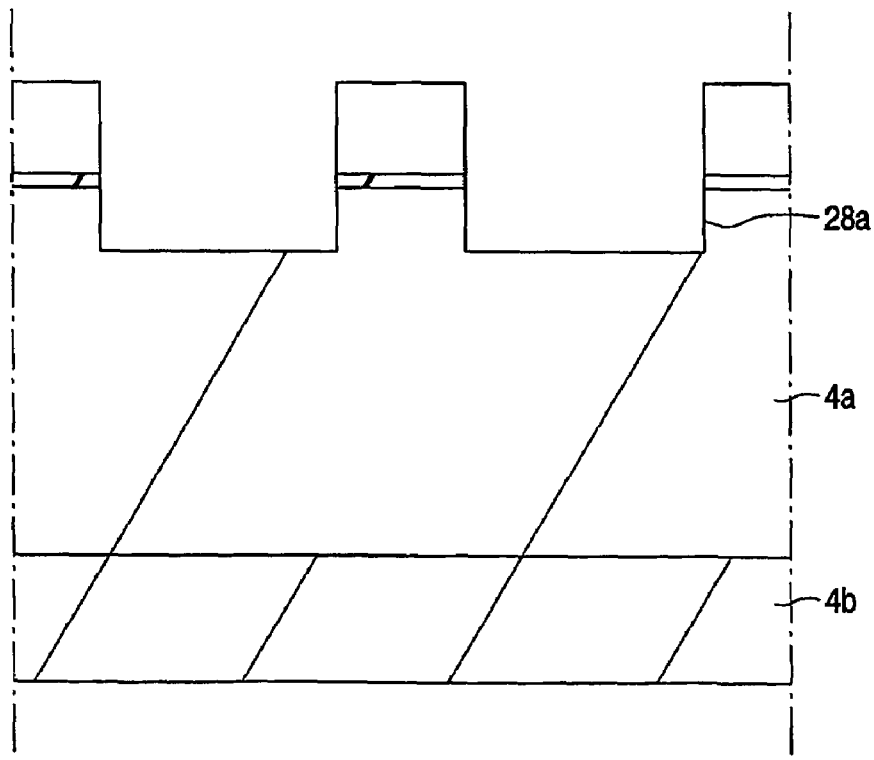
Figure 3:
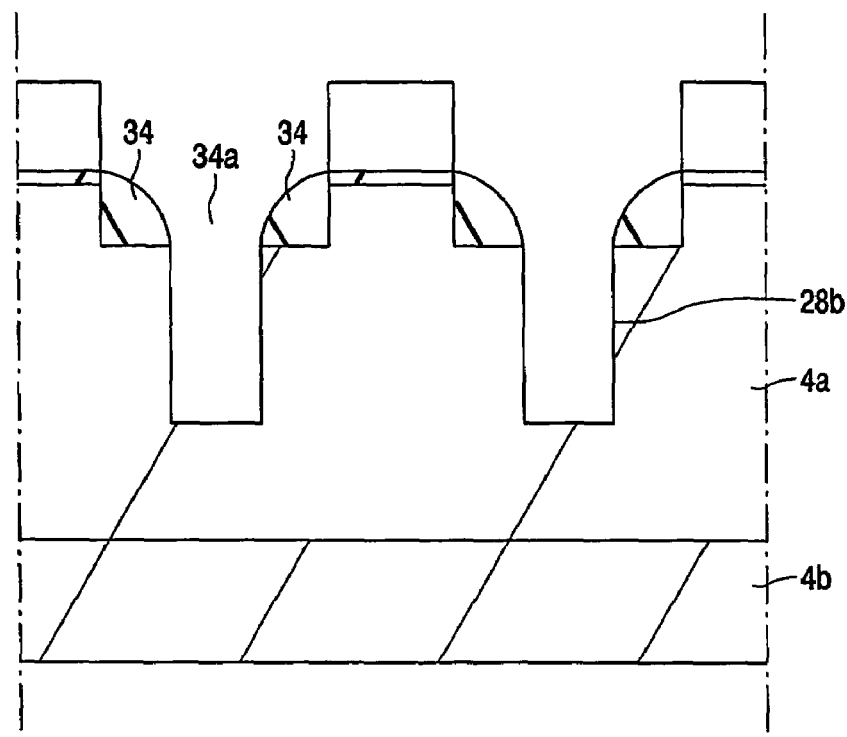

An etching treatment is now carried out at the windows 32a of the mask 32 to form first grooves 28a as shown in FIG. 2. A uniform layer of silicon nitride (for example) is then deposited and an anisotropic etch applied to leave spacers 34 adjacent the sidewalls of the first grooves 28a (see FIG. 3). Spacers 34 in turn define windows 34a therebetween for a further etching treatment to form second grooves 28b which extend down into the semiconductor body from the bottom of the first grooves 28a.

Figure 4:
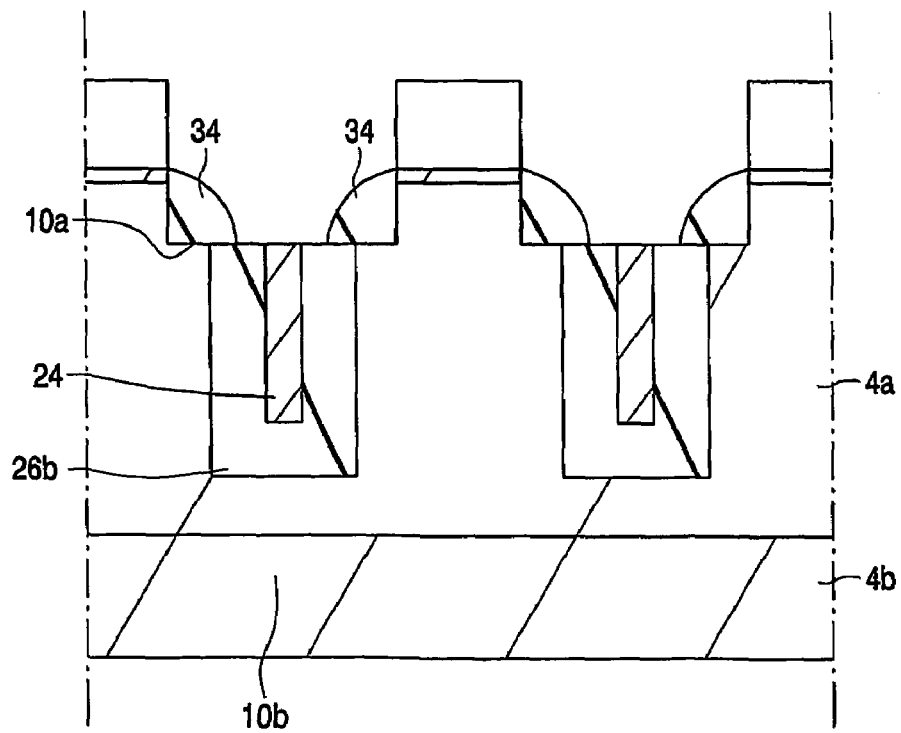

Next, as illustrated in FIG. 4, an oxidation process is carried out to form oxide layer 26b at the bottom and sidewalls of the second grooves 28b. Preferably, a thermal oxidation is performed. This consumes silicon at these surfaces, and the resulting layer extends approximately equal distances away from the plane of the original silicon surfaces. For example, the oxide may be grown 0.2 microns in each direction, to form a layer 0.4 microns thick. The boundary between field plate insulating layer 26b and the semiconductor body 20 defines a second trench portion 10b of the finished device, whilst first groove 28a defines a first, wider trench portion 10a. Doped polycrystalline silicon is then deposited in a known manner and then etched back, until the material is only left in the space surrounded on three sides by the insulating layer 26b, to form field plate 24. The endpoint of this etching step is clearly defined, as at this point, the insulating layer 26b is exposed as the polycrystalline silicon is etched back level with the bottom of the first trench portion. Refractive monitoring for example may be used to detect exposure of the upper surface of the insulating layer 26b.

Although the first trench portion 10a is wider than the second trench portion 10b in the embodiment of FIG. 4, it will be appreciated that the process described may be carried out such that the first and second portions 10a and 10b are substantially the same width.

Figure 5:
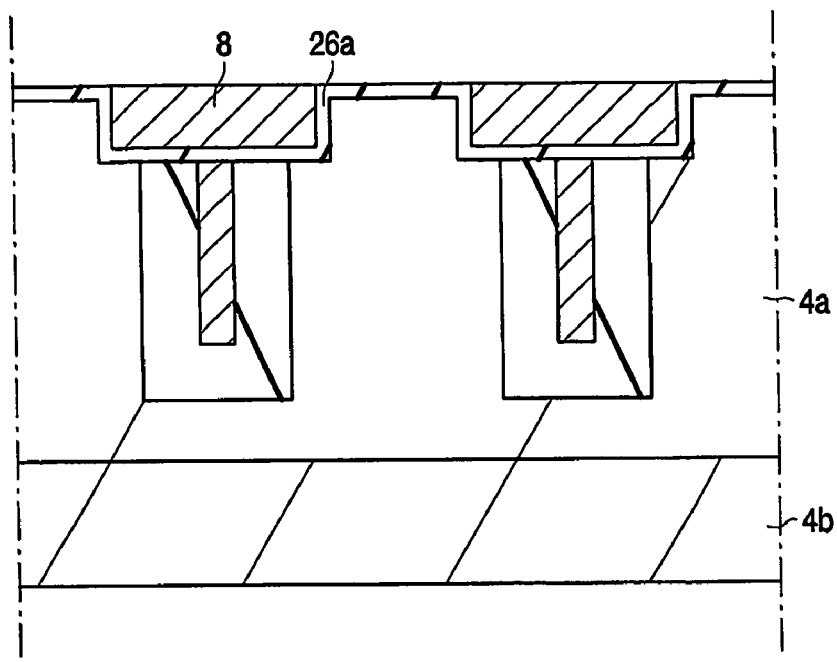

The spacers 34 are then removed, for example, by a spray etch process. A thin gate insulating layer 26a is subsequently deposited over the sidewalls and bottom of the first trench portion 10a, and also over the exposed upper surface of the field plate 24. A second sequence of deposition and etch back of doped polycrystalline silicon is next carried out to form a gate 8 in the first trench portion 10a, as shown in FIG. 5.

Further processing is carried out in a known manner to form implanted source region 2 and channel-accommodating region 6, an insulating cap 38 over the gate 8, and source and drain electrodes 18, 22 over the top and bottom major surfaces 20a, 20b of the semiconductor body, respectively, to form the structure illustrated in FIG. 6.

As noted in U.S. Pat. No. 5,998,833 and EP-A-1170803, the inclusion of a trenched field plate connected to the source region in a trench-gate device is beneficial for the device performance. Furthermore, the inventors have found that application of a bias potential to the field plate greater than the gate potential and near to the bulk breakdown voltage of the drain drift region affords further performance improvements In particular, a bias potential around 60 to 100% of the bulk breakdown voltage of the drain drift region is preferable. More particularly, a bias potential of around 80% of the bulk breakdown voltage of the drain drift region is preferred, as it allows some tolerance of variations in the width of the transition region between the drain drift and contact regions which may lead to variations in the level of doping in the drain drift region around the bottom of the trench.

Figure 8:
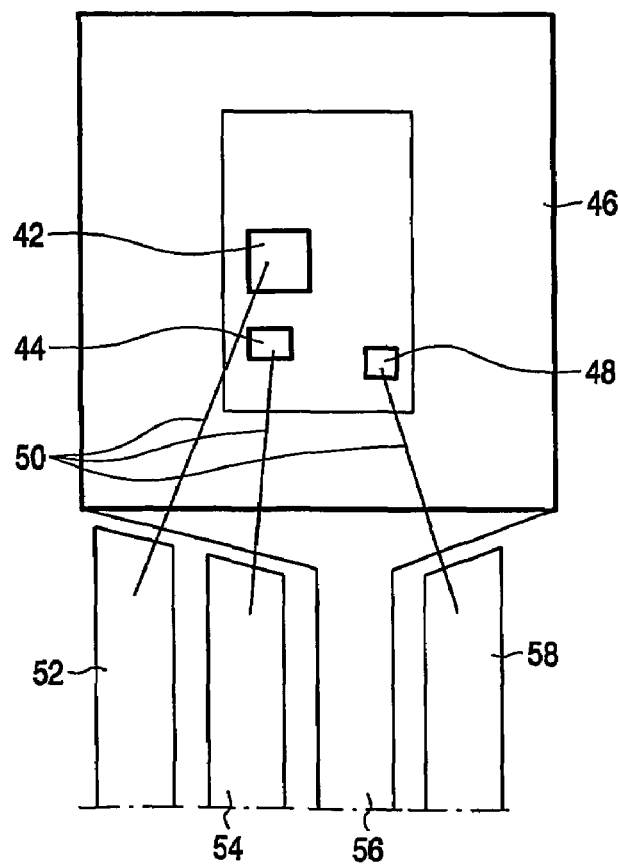
FIG. 8 is an internal plan view of the packaging of a discrete device embodying the invention.

FIG. 8 shows an internal plan view of the packaging of a discrete device in accordance with an embodiment of the invention. A MOSFET die 40 has a gate bond pad 42 connected to its gate contact electrode, a source bond pad 48 connected to its source contact electrode, and a field plate bond pad 44 connected to its field plate contact electrode for applying an independent bias thereto. The MOSFET is mounted on a drain pad 46, which is electrically connected to the drain electrode 22 on the bottom major surface of the MOSFET die. Bond wires 50 connect the bond pads 42, 44, 48 to respective terminals or pins 52, 54 and 58. Drain pad 46 directly contacts the respective pin 56. The packaging may be completed in a known manner.

Figure 9:
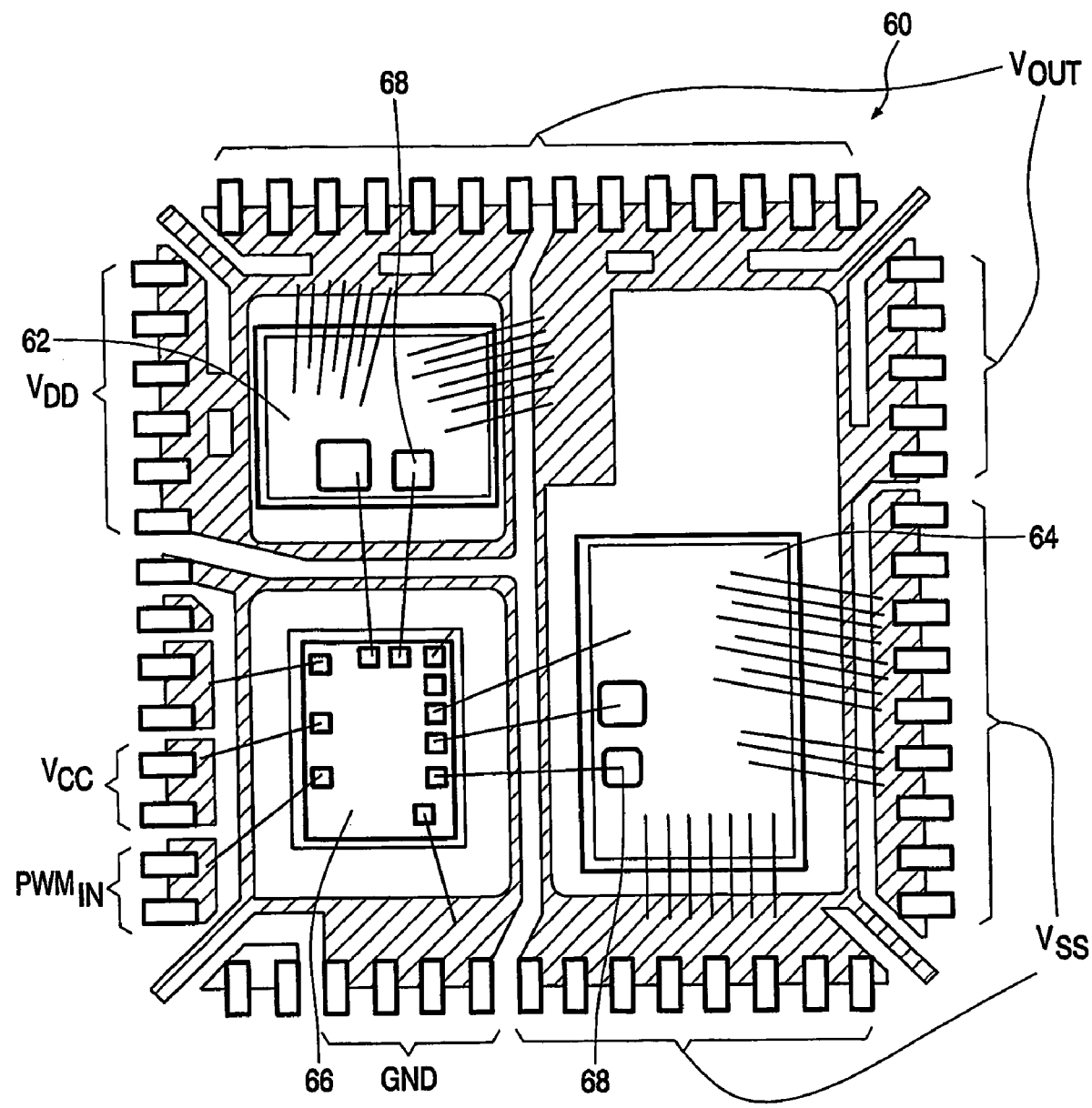
FIG. 9 is an internal plan view of the packaging of a module embodying the invention.

In preferred embodiments of the invention, a semiconductor device as described above is included in a module, with its field plate(s) connected to an internal voltage line or level of the module. As an example of this, FIG. 9 shows an internal plan view of the packaging of a module 60 including two semiconductor devices having biased field plates of the form described above. The module is a DC-DC converter, for use as a VRM in a PC motherboard, for example. A known DC-DC converter circuit and its operation are described in U.S. Pat. No. 6,175,225 of the present applicant (our ref. PHB34370), the contents of which are hereby incorporated herein as reference material. The configuration shown in FIG. 9 is a modified implementation of the circuit shown in FIG. 3 of U.S. Pat. No. 6,175,225.

The module of FIG. 9 includes a control MOSFET 62, a "sync" MOSFET 64, and a driver IC 66. The MOSFETs correspond to first and second switches 5 and 6 of FIG. 3 of U.S. Pat. No. 6,175,225, respectively. They are connected in series between a DC input, $V_{DD}$, and ground, $V_{SS}$. The switches are closed alternately in response to a switching signal, $PWM_{IN}$, which is inputted to driver IC 66. The further operation of a circuit of this type is described in U.S. Pat. No. 6,175,225.

In accordance with the present invention, each MOSFET 62, 64 includes a field plate bond pad 68 which is connected to the respective field plate contact electrode of each MOSFET. The field plate bond pad of sync MOSFET 64 is connected to the power supply voltage, $V_{CC}$, via the driver IC, for example, which may typically be 5 or 12V. In the circuit shown in FIG. 3 of U.S. Pat. No. 6,175,225, the gate drive to the control MOSFET ("first switch 5") is via a boost or reservoir capacitor 37 connected between a boost terminal 33 and Vout. In this case, the field plate bond pad of control MOSFET 62 would be connected to boost terminal 33.

In an example where $V_{CC}$ is 12V, the silicon selected for the MOSFETs 62 and 64 may have a bulk breakdown voltage of around 15V or more, for example.

It will be appreciated that other potentials may be provided in a module for connection to the field plate bond pad of a MOSFET, for example via an external pin of the module or by including additional circuitry within the module.

Low doped drain drift region 4a may typically be grown as an epitaxial layer of the first conductivity type. The doping concentration of the drift region may be substantially uniform throughout its depth. Nevertheless, it may be preferable to vary the concentration across the drift region. In particular, providing a doping profile with the concentration decreasing (for example in a linear manner) in the direction from the drain contact region 4b towards the channel-accommodating region 6 may reduce the on-resistance of the device.

Figure 10:
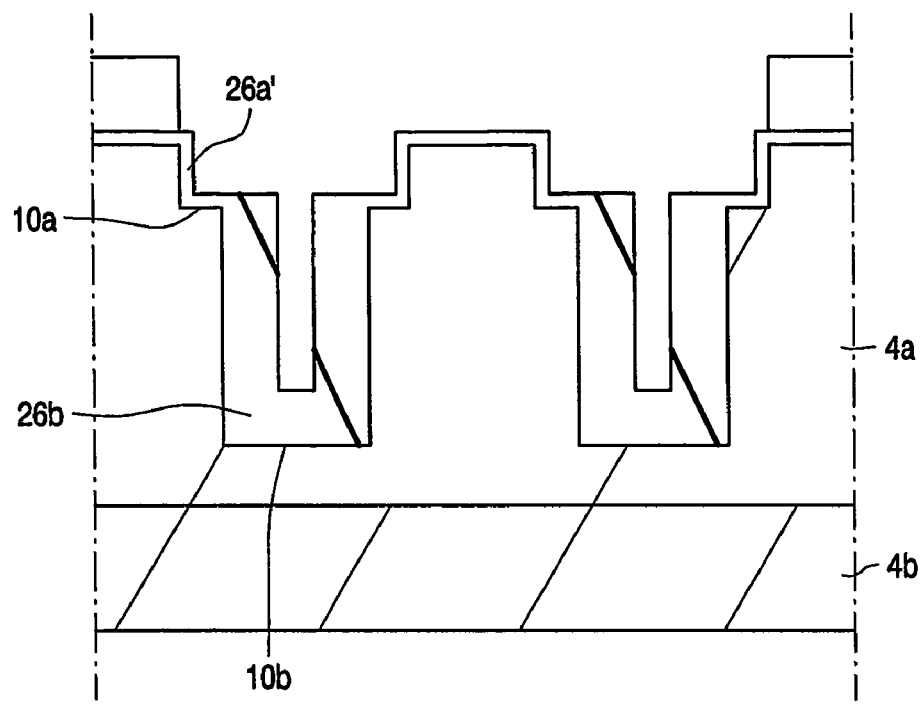
FIGS. 10 and 11 are cross-sectional views of transistor cell areas of a semiconductor body at successive stages in the manufacture of a trench-gate semiconductor device according to a further embodiment of the invention.

The process described above with respect to FIGS. 1 to 6 may be modified in a further embodiment of the invention. In particular, after growth of the field plate insulating layer 26b as described in relation to FIG. 4 above, the spacers 34 may be removed, and a gate insulating layer 26a' deposited (or may be thermally grown) over the sidewalls and bottom of the first trench portion 10a, before deposition of electrode material to fill both the first and second trench portions 10a, 10b, as shown in FIG. 10. The electrode material is planarised level with the silicon dioxide layer 30 on the top major surface 20a of the semiconductor body 20. Thus, in this embodiment, field plate 24 is integral with the gate 8. Provision of a field plate at gate potential which extends into the drain drift region improves the breakdown characteristics of the device.

Figure 11:
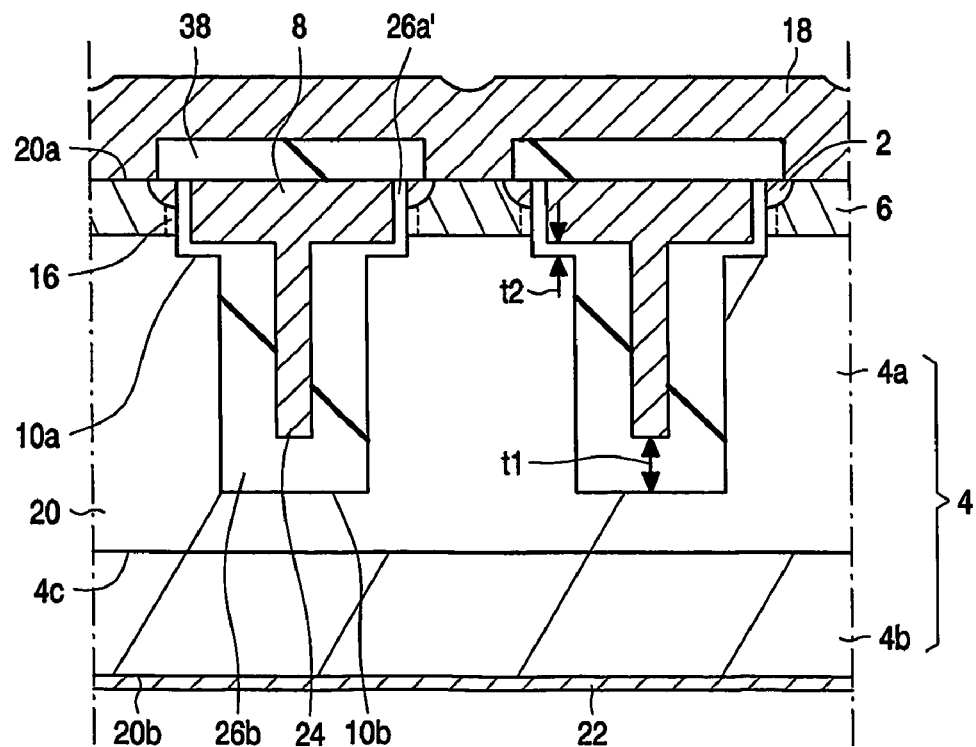

Then in a similar manner to the embodiment of FIGS. 1 to 6, further processing is carried out in a known manner to form implanted source region 2 and channel-accommodating region 6, an insulating cap 38 over the gate 8, and source and drain electrodes 18, 22 over the top and bottom major surfaces 20a, 20b of the semiconductor body, respectively, to form the structure illustrated in FIG. 11.

It will be evident that many variations and modifications are possible within the scope of the invention. The particular examples described above are n-channel devices, in which the source and drain regions 2 and 4 are of n-type conductivity, the channel-accommodating body region 6 is of p-type conductivity, and an electron inversion channel 16 is induced in the region 6 by the gate 8. By using opposite conductivity type dopants, a p-channel device can be made. In that case, regions 2 and 4 are of p-type, the region 6 is of n-type, and a hole inversion channel is induced in the region 6 by the gate 8.

Furthermore, a device may be manufactured in accordance with the invention of the p-channel type, having p-type source and drain regions 2 and 4, and a p-type channel-accommodating region 6. It may also have an n-type deep localised region within each cell. N-type polycrystalline silicon may be used for the gate 8. In operation, a hole accumulation channel 16 is induced in the region 6 by the gate 8 in the on-state. The low-doped p-type region 6 may be wholly depleted in the off-state, by depletion layers from the insulated gate 8 and from the deep n-type region.

A vertical discrete device has been illustrated with reference to FIGS. 1 to 7, having its drain electrode 22 contacting the region 4b at the back surface 20b of the body 20. However, an integrated device is also possible in accordance with the invention. In this case, the region 4b may be a doped buried layer between a device substrate and the epitaxial low-doped drain region 4a. This buried layer region 4b may be contacted by an electrode at the front major surface 20a, via a doped peripheral contact region which extends from the surface 20a to the depth of the buried layer.

Semiconductor materials other than silicon may be used for devices in accordance with the invention, for example, silicon carbide.

No plan view of the cellular layout geometry for a vertical device is shown in the drawings, because the invention is applicable to quite different, known cell geometries. Thus, for example the cells may have a square geometry, or they may have a close-packed hexagonal geometry or an elongate stripe geometry. In each case, the trench 10 (with its gate 8) extends around the boundary of each cell. FIGS. 1 to 7 shows only two cells, but typically the device comprises many hundreds of these parallel cells between the electrodes 18 and 22. Similarly, only one cell is shown in FIG. 6 for the purposes of illustration.

The active cellular area of the device may be bounded around the periphery of the body 20 by various known peripheral termination schemes (also not shown). Such schemes normally include the formation of a thick field-oxide layer at the peripheral area of the body surface 20a, before the transistor cell fabrication steps. Furthermore, various known circuits (such as gate-control circuits) may be integrated with the device in an area of the body 20, between the active cellular area and the peripheral termination scheme. Typically their circuit elements may be fabricated with their own layout in this circuit area using some of the same masking and doping steps as are used for the transistor cells.

From reading the present disclosure, other variations and modifications will be apparent to persons skilled in the art. Such variations and modifications may involve equivalent and other features which are already known in the art, and which may be used instead of or in addition to features already described herein.

Although claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

The Applicants hereby give notice that new claims may be formulated to such features and/or combinations of such features during the prosecution of the present Application or of any further Application derived therefrom.

The invention claimed is:

1. A method of manufacturing a trench-gate semiconductor device, the device having a semiconductor body defining a first portion of a trench having an insulated gate therein, a second portion of the trench extending from the bottom of the first trench portion, the semiconductor: body comprising a source region and a drain region of a first conductivity type which are separated by a channel-accommodating region adjacent to the first trench portion, the drain region comprising a drain drift region and a drain contact region, with the drain drift region between the channel-accommodating region and the drain contact region, and the drain drift region doped to a lesser extent than the drain contact region, and a field plate in the second portion of the trench between the gate and the drain contact region, the method comprisinging the steps of:
   (a) etching a first groove into the semiconductor body;
   (b) forming spacers adjacent the sidewalls of the first groove which define a window therebetween;
   (c) etching a second groove into the semiconductor body through the window between the spacers, the second groove extending from the bottom of the first groove towards the drain contact region and being narrower than the first groove; and
   (d) forming a field plate insulating layer by oxidising the bottom and sidewalls of the second groove;
   (e) providing the field plate over the field plate insulating layer in the second groove by filling the first and second grooves with electrode material, and etching it back until the field plate insulating layer is exposed;
   (f) removing the spacers;
   (g) forming a gate insulating layer over the field plate and at the bottom and sidewalls of the first groove; and
   (h) providing the gate over the gate insulating layer.

2. The method as recited in claim 1, further comprising the steps of:
   (i) removing the spacers;
   (j) forming a gate insulating layer over the bottom and sidewalls of the first groove and then
   (k) filling the first and second grooves with electrode material to form the gate and field plate.

3. A trench-gate semiconductor device manufactured according to the method of claim 1, wherein the width of the first trench portion is greater than the width of the second trench portion.

4. A trench-gate semiconductor device manufactured according to the method of claim 1 wherein the field plate is connected to the source region.

5. A trench-gate semiconductor device manufactured according to the method of claim 1 wherein the field plate is connected to a bias potential greater than the gate potential and near to the bulk breakdown voltage of the drain drift region.

6. A module comprising a trench-gate semiconductor device as-recited in claim 5 wherein the field plate is connected to an internal voltage line of the module.

7. The trench-gate semiconductor device as recited in claim 5, wherein an additional external terminal is provided which is electrically connected to the field plate.

8. The trench-gate semiconductor device as recited in claim 5, wherein the bias potential is around 60 to 100% of the bulk breakdown voltage of the drain drift region.

9. The trench gate semiconductor device as recited in claim 8, wherein the bias potential is around 80% of the bulk breakdown voltage of the drain drift region.

10. The module as recited in claim 6, wherein an additional external terminal is provided which is electrically connected to the field plate.

11. The module as recited in claim 6, wherein the bias potential is around 60 to 100% of the bulk breakdown voltage of the drain drift region.

12. The trench-gate semiconductor device as recited in claim 7, wherein, the bias potential is around 60 to 100% of the bulk breakdown voltage of the drain drift region.

* * * * *